(12) United States Patent  
Morino et al.

(10) Patent No.: US 8,917,103 B2  
(45) Date of Patent: Dec. 23, 2014

(54) DEVICE AND METHOD FOR TESTING SEMICONDUCTOR DEVICE

(75) Inventors: Koichi Morino, Kanagawa (JP); Kouichi Ikeda, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 517 days.

(21) Appl. No.: 13/198,879

(22) Filed: Aug. 5, 2011

(65) Prior Publication Data

US 2012/0032696 A1 Feb. 9, 2012

(30) Foreign Application Priority Data

Aug. 9, 2010 (JP) ................... 2010-178442

(51) Int. Cl.
| | | |
|---|---|---|
| *G01R 31/10* | (2006.01) | |
| *G01R 31/02* | (2006.01) | |
| *H01L 35/00* | (2006.01) | |
| *G01R 31/28* | (2006.01) | |

(52) U.S. Cl.
CPC .................................. *G01R 31/2875* (2013.01)
USPC ................. 324/750.14; 324/537; 327/513

(58) Field of Classification Search
CPC .................................................. G01R 31/2886
USPC ....................................... 324/750.14; 327/306
See application file for complete search history.

(56) References Cited

U.S. PATENT DOCUMENTS

| | | | | |
|---|---|---|---|---|
| 6,946,856 | B1 * | 9/2005 | Tellkamp | 324/754.1 |
| 6,975,047 | B2 * | 12/2005 | Pippin | 307/117 |
| 7,863,942 | B2 | 1/2011 | Morino | |
| 2007/0216468 | A1 * | 9/2007 | Duarte | 327/513 |
| 2008/0278868 | A1 * | 11/2008 | Morino | 361/18 |
| 2009/0189668 | A1 * | 7/2009 | Morino | 327/306 |
| 2011/0121870 | A1 | 5/2011 | Morino | |

FOREIGN PATENT DOCUMENTS

| | | |
|---|---|---|
| JP | 4-158532 | 6/1992 |
| JP | 9-128996 | 5/1997 |
| JP | 2852992 | 11/1998 |
| JP | 2000-298156 | 10/2000 |
| JP | 2005-130568 | 5/2005 |
| JP | 2008-52564 | 3/2008 |
| JP | 2008-282118 | 11/2008 |
| JP | 2009-198476 | 9/2009 |
| JP | 2011-107075 | 6/2011 |

OTHER PUBLICATIONS

Japanese official action dated Jan. 7, 2014 in corresponding Japanese patent application No. 2010-178442.

* cited by examiner

*Primary Examiner* — Jermele M Hollington  
*Assistant Examiner* — Christopher McAndrew  
(74) *Attorney, Agent, or Firm* — Cooper & Dunham LLP (57) ABSTRACT

A testing method for testing a semiconductor device includes heating the semiconductor device until the temperature of the semiconductor device reaches a predetermined temperature; conducting other functional tests other than testing of the overheat protection function in a second step after the temperature of the semiconductor device has reached the predetermined temperature; allowing the semiconductor device to generate heat by itself such that the overheat protection function of the semiconductor device is activated, detecting a first diode forward voltage of a desired diode contained in the semiconductor device when the overheat protection function of the semiconductor device is activated and computing a first computational temperature of the semiconductor device based on the detected first diode forward voltage of the desired diode contained in the semiconductor device; and determining whether the computed first computational temperature of the semiconductor device resides in the overheat protection function activating temperature range.

7 Claims, 8 Drawing Sheets

DEVICE AND METHOD FOR TESTING SEMICONDUCTOR DEVICE

BACKGROUND OF THE INVENTION

1. Field of the Invention

The disclosures herein relate to a testing method for testing a semiconductor device and a testing device for testing a semiconductor device. More specifically, the disclosures herein relate to a testing method and a testing device for testing a semiconductor device including an overheat protection function that is activated when a temperature of the semiconductor device resides in an overheat protection function activating temperature range and is deactivated when the temperature of the semiconductor device resides in an overheat protection function deactivating temperature range.

2. Description of the Related Art

Semiconductor devices generally include an overheat protection circuit so as to prevent the semiconductor device from being damaged or deteriorated due to overheating caused by an increase in an ambient environment temperature or breakdown of a cooling fan. The overheat protection circuit is configured to be activated when the semiconductor device reaches a predetermined temperature or above.

In the semiconductor device including such an overheat protection circuit, whether a temperature at which the overheat protection function of the overheat protection circuit is activated falls within an allowable temperature range is tested. Examples of such a temperature range testing method may be given as follows.

One of the temperature range testing methods includes heating the semiconductor device by a handling device in which the lower threshold of the allowable temperature range is set, and ensuring that the overheat protection function is not activated in a state of being heated in the above manner. The temperature range testing method further includes subsequently heating the semiconductor device by another handling device in which the upper threshold of the allowable temperature range is set, and ensuring that the overheat protection function is activated in a state of being heated in the above manner.

Another temperature range testing method is disclosed in Japanese Patent No. 2852992 (hereinafter referred to as "Patent Document 1"). The disclosed testing method includes a first process of heating a semiconductor device by utilizing a handling device in which the lower threshold of the allowable temperature range is set and subsequently ensuring that the overheat protection function is not activated in a state of being heated at the set lower threshold of the allowable temperature range, and a second process of measuring a period from a self-heat generation initiating time at which the semiconductor device initiates self-heat generation to the overheat protection function activating time at which the overheat protection function is activated and subsequently ensuring that the measured time falls within a predetermined time.

The overheat protection function of the overheat protection circuit is generally configured to be activated when there is a possibility of damaging the semiconductor device due to overheating, and hence the overheat protection function of the overheat protection circuit is designed to be activated when the temperature of the semiconductor device reaches the absolute maximum rating temperature or above. Accordingly, the lower threshold of the allowable temperature range within which the overheat protection function of the overheat protection circuit is activated may be higher than the absolute maximum rating temperature of the semiconductor device.

Further, ordinary operations of the semiconductor device may also be tested under the absolute maximum rating temperature or below.

Thus, the testing method disclosed in Patent Document 1 may require carrying out two tests utilizing two handling devices, one for testing the overheat protection circuit and the other one for testing the operations of the semiconductor device under the absolute maximum rating temperature or below, or utilizing one handling device by altering the settings of the handling device appropriately for each test. Further, in a case where the semiconductor device is allowed to generate heat by itself (self-heating), the semiconductor device transfers heat from its package surface and measuring terminal. Accordingly, a subtle difference of a contact condition in the measuring terminal or a subtle difference in the testing environment temperature may vary the time required for initiating the activation of the overheat protection function, which may result in poor reproducibility.

SUMMARY OF THE INVENTION

It is a general object of at least one embodiment of the present invention to provide a testing method and a testing device for testing a semiconductor device capable of accurately conducting a series of tests all at once with feasible reproducibility by utilizing one handling device, which substantially eliminates one or more problems caused by the limitations and disadvantages of the related art.

According to an embodiment, there is provided a testing method for testing a semiconductor device, which includes an overheat protection function activated when a temperature of the semiconductor device resides in an overheat protection function activating temperature range and deactivated when the temperature of the semiconductor device resides in an overheat protection function deactivating temperature range. The testing method includes heating the semiconductor device until the temperature of the semiconductor device reaches a predetermined temperature in a first step; conducting other functional tests other than testing of the overheat protection function in a second step after the temperature of the semiconductor device has reached the predetermined temperature in the first step; allowing the semiconductor device to generate heat by itself such that the overheat protection function of the semiconductor device is activated; detecting a first diode forward voltage of a desired diode contained in the semiconductor device when the overheat protection function of the semiconductor device is activated and computing a first computational temperature of the semiconductor device based on the detected first diode forward voltage of the desired diode contained in the semiconductor device in a third step; and determining whether the computed first computational temperature of the semiconductor device resides in the overheat protection function activating temperature range in a fourth step.

According to an embodiment, there is provided a testing device for testing a semiconductor device, which includes an overheat protection function activated when a temperature of the semiconductor device resides in an overheat protection function activating temperature range and deactivated when the temperature of the semiconductor device resides in an overheat protection function deactivating temperature range. The testing device includes a heating unit configured to heat the semiconductor device until the temperature of the semiconductor device reaches a predetermined temperature; a test unit configured to conduct other functional tests other than testing of the overheat protection function after the temperature of the semiconductor device has reached the predetermined temperature; a self-heat generating unit configured to allow the semiconductor device to generate heat by itself such that the overheat protection function of the semiconductor device is activated; a computing unit configured to detect a diode forward voltage of a desired diode contained in the semiconductor device when the overheat protection function of the semiconductor device is activated and compute a computational temperature of the semiconductor device based on the detected diode forward voltage of the desired diode contained in the semiconductor device; and a determining unit configured to determine whether the computed computational temperature of the semiconductor device resides in the overheat protection function activating temperature range.

BRIEF DESCRIPTION OF THE DRAWINGS

Other objects and further features of embodiments will be apparent from the following detailed description when read in conjunction with the accompanying drawings, in which.

DESCRIPTION OF THE PREFERRED EMBODIMENTS

In a testing method and a testing device for testing a semiconductor device according to an embodiment, a temperature of the semiconductor device when an overheat protection function of an overheat protection circuit is activated is computed based on a forward voltage of a temperature detective diode arranged in the semiconductor device, and whether the overheat protection circuit operates appropriately is determined based on the computed temperature. Further, in the testing method and the testing device for testing a semiconductor device according to the embodiment (hereinafter simply called "the testing method and the testing device according to the embodiment"), a heating period of the semiconductor device is controlled by minimizing an error range, which is a difference between a temperature of the semiconductor device when the overheat protection function is activated and a temperature of the semiconductor device computed based on the diode forward voltage.

Figure 1:
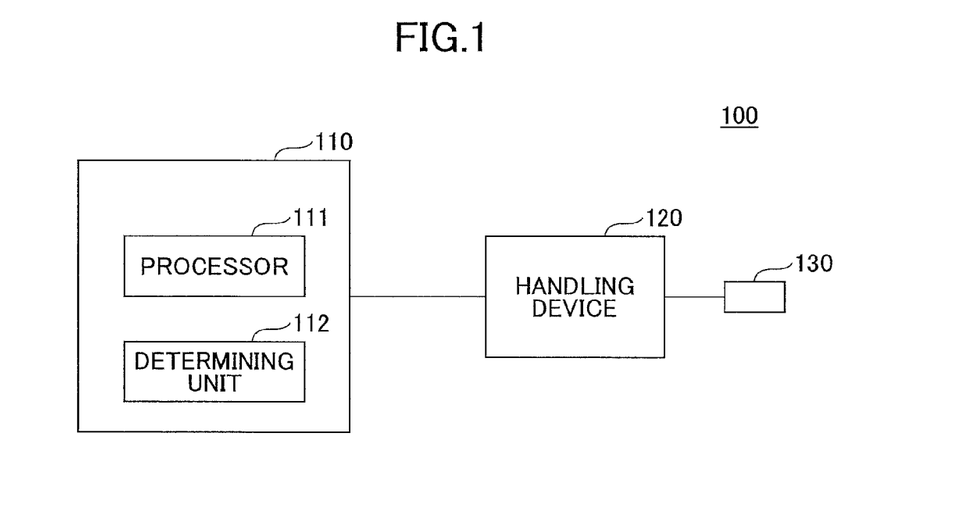
FIG. 1 is a schematic diagram illustrating a testing device according to an embodiment.

In the following, embodiments of the present invention will be described with reference to the accompanying drawings. FIG. 1 is a schematic diagram illustrating the testing device according to the embodiments.

The testing device 100 according to the embodiment includes a control device 110 and a handling device 120. As illustrated in FIG. 1, a semiconductor device 130 to be tested is connected to the testing device 100 having such a configuration via the handling device 120. In such a configuration, the testing device 100 according to the embodiment conducts a test on the semiconductor device 130. The semiconductor device 130 utilized in the testing method and the testing device 100 according to the embodiment includes an overheat protection circuit implementing an overheat protection function so as to protect the semiconductor device 130 from being heated at a temperature higher than a certain temperature. The testing device 100 according to the embodiment conducts an overheat protection functional test on the semiconductor device 130 so as to determine whether the overheat protection function of the semiconductor device 130 operates appropriately.

The control device 110 in the testing device 100 according to the embodiment may be implemented by a computer including a processor and a memory device. As illustrated in FIG. 1, the control device 110 arranged in the testing device 100 according to the embodiment includes a processor 111 and determining unit 112. The processor 111 controls all of the control device 110. The processor 111 is configured to compute a temperature of the semiconductor device 130 as described later. The determining unit 112 is configured to determine whether the semiconductor device 130 is a qualified product based on the temperature of the semiconductor device 130 computed by the processor 111.

The handling device 120 in the testing device 100 according to the embodiment is configured to heat the semiconductor device 130. The handling device 120 may be controlled by the control device 110 such that the handling device 120 may control a heating period for the semiconductor device 130.

Next, the handling device 120 and the semiconductor device 130 utilized in the testing device 100 according to the embodiment are described with reference to FIGS. 2 through 4.

Figure 2:
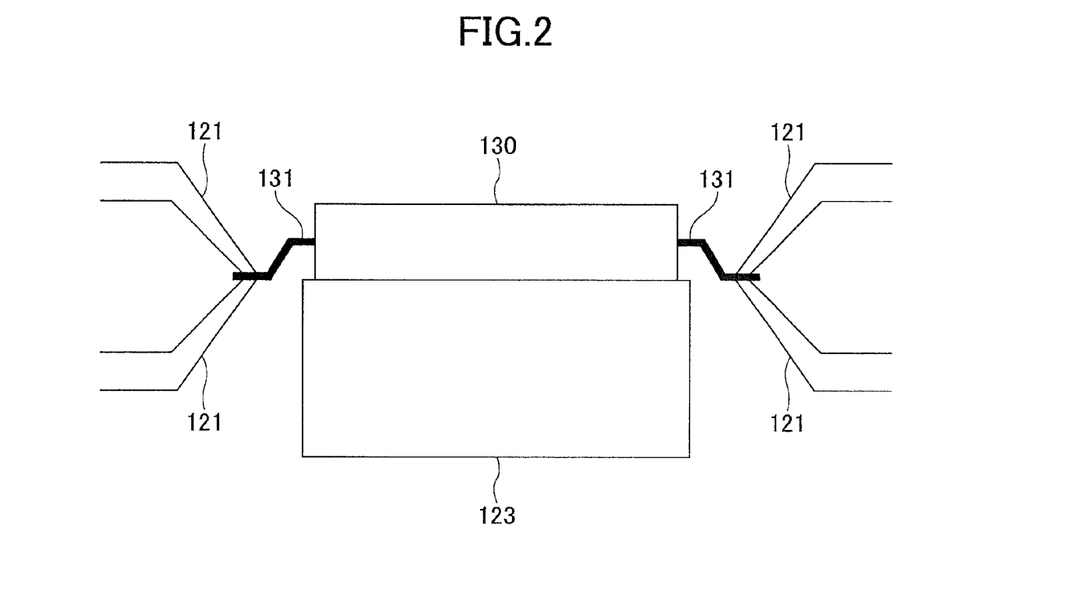
FIG. 2 is a side diagram of the testing device according to the embodiment by which a semiconductor device test is conducted.

FIG. 2 is a side diagram of the testing device 100 according to the embodiment by which a semiconductor device 130 is tested. The semiconductor device 130 includes external terminals 131 such that the semiconductor device 130 is fixed to probes 121 provided in the handling device 120 via the external terminals 131. The semiconductor device 130 is arranged to be brought into contact with a heating control device 123 (see FIG. 2) provided in the handling device 120 such that the heating control device 123 may heat the semiconductor device 130.

Figure 3:
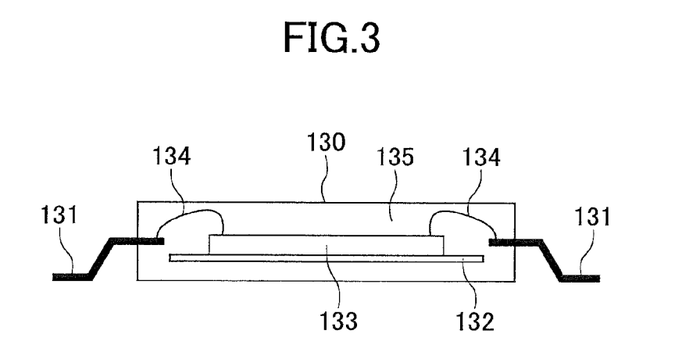
FIG. 3 is a cross-sectional diagram illustrating an internal structure of the semiconductor device.

FIG. 3 is a cross-sectional diagram illustrating an internal structure of the semiconductor device 130. As illustrated in FIG. 3, inside the semiconductor device 130, a semiconductor element 133 is bonded to a lead frame (supporting plate) 132, and the semiconductor element 133 is connected to the external terminals 131 via wires 134. The semiconductor element 133 includes a silicon substrate and circuits formed on a surface of the silicon substrate. In the semiconductor device 130, the above elements are sealed by package resin 135.

Figure 4:
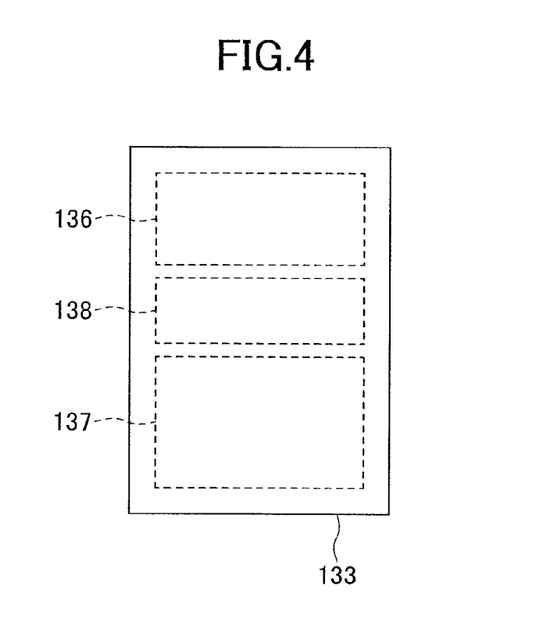
FIG. 4 is a functional diagram illustrating a functional configuration of circuits formed on a semiconductor element contained in the semiconductor device tested by the testing device according to an embodiment.

FIG. 4 is a functional diagram illustrating a functional configuration of circuits formed on the semiconductor element 133 contained in the semiconductor device 130. The semiconductor element 133 includes an output driver element 136, an output driver control circuit 137 and a temperature detector 138. The output driver element 136 is configured to externally output signals from the semiconductor device 130 and be controlled by the output driver control circuit 137. The temperature detector 138 is configured to detect a temperature of the semiconductor device 130. In the semiconductor element 133, a major heat generating source may be the output driver element 136. Thus, the temperature detector 138 may be arranged near the overheat protection circuit (not illustrated) configured to detect overheating of the semiconductor element 133.

In the testing method and the testing device 100 according to the embodiment, the semiconductor device 130 is heated via the handling device 120 controlled by the control device 110 so as to carry out an operational test of the semiconductor device 130. The operational test of the semiconductor device 130 includes operational (i.e., functional) tests carried out within an operable temperature range of the semiconductor device 130 and operational (i.e., functional) tests of the overheat protection circuit in which the semiconductor 130 is heated at temperatures exceeding the operable temperature range of the semiconductor device 130.

As is clear from the above, the testing method and the testing device 100 according to the embodiment is specifically characterized by testing of the overheat protection function via the overheat protection circuit. Thus, the operational test on the overheat protection function via the overheat protection circuit is described in more detail.

Figure 5:
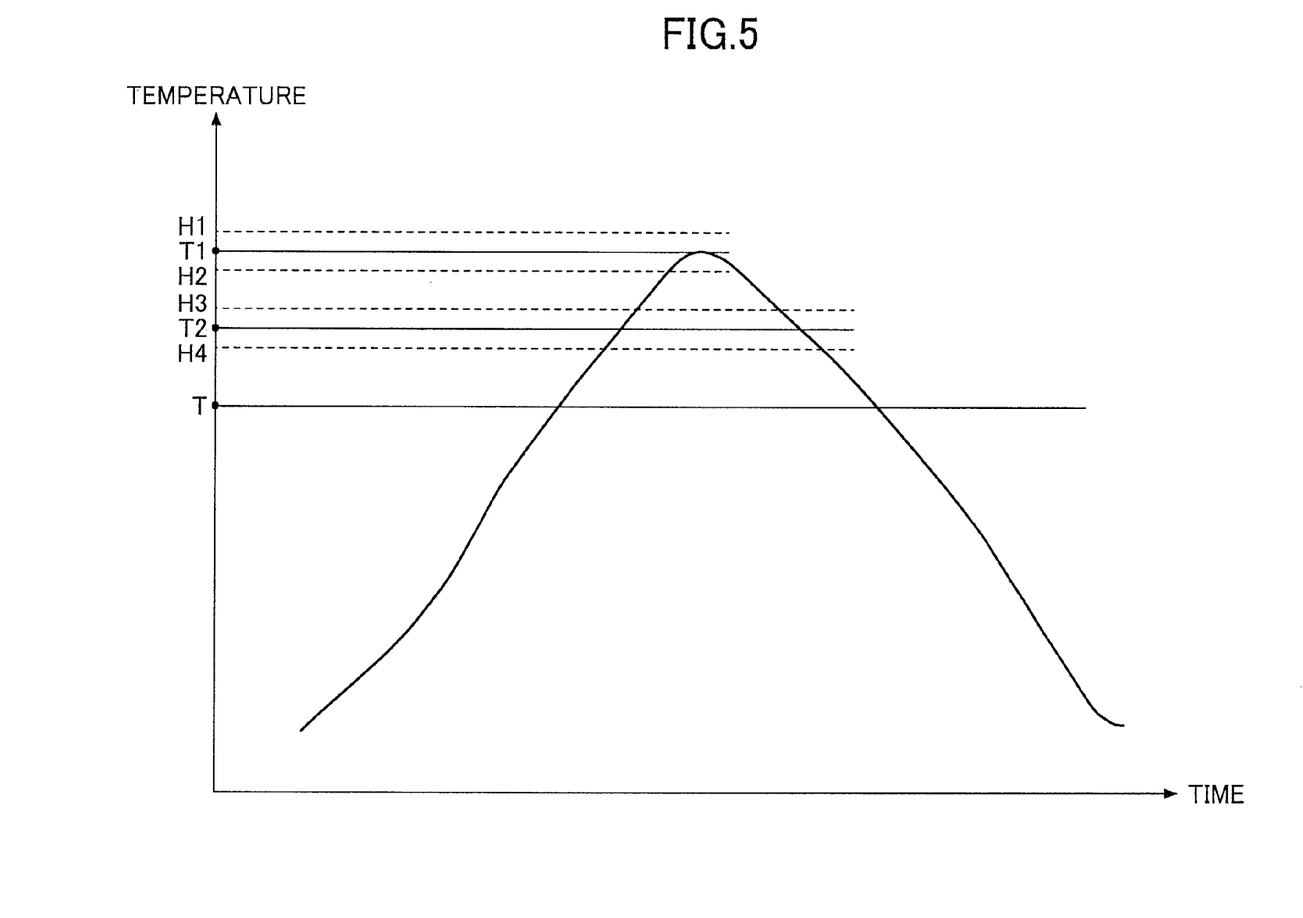
FIG. 5 is a diagram illustrating temperature changes of the semiconductor device.

Referring to FIG. 5, temperature changes of the semiconductor device 130 arranged in the testing device 100 according to the embodiment are described first. FIG. 5 is a diagram illustrating temperature changes of the semiconductor device 130.

In FIG. 5, a temperature "T" indicates the maximum operable temperature of the semiconductor device 130. The maximum operable temperature indicates un upper threshold of an operable temperature range of the semiconductor device 130.

In FIG. 5, the temperature "T1" indicates an overheat protection function activating temperature at which the overheat protection function of the overheat protection circuit in the semiconductor device 130 is activated. Further, in FIG. 5, the temperature "H1" indicates an upper threshold of an allowable overheat protection function activating temperature range of the semiconductor device 130 and the temperature "H2" indicates a lower threshold of the allowable overheat protection function activating temperature range of the semiconductor device 130. In the testing method and testing device according to the embodiment, the temperatures H1 and H2 are predetermined temperatures, and the semiconductor device 130 is designed such that the overheat protection function is activated in a temperature range between the temperature H1 and the temperature H2. That is, the overheat protection function activating temperature range indicates a temperature range between the temperature H1 and the temperature H2. If the overheat protection circuit serving as the overheat protection function in the semiconductor device 130 is capable of being activated within such an overheat protection function activating temperature range, the tested semiconductor device 130 may be determined as a qualified product.

In FIG. 5, a temperature "T2" indicates an overheat protection function deactivating temperature at which the overheat protection function of the overheat protection circuit in the semiconductor device 130 is deactivated. Further, in FIG. 5, a temperature "H3" indicates an upper threshold of an allowable overheat protection function deactivating temperature range of the semiconductor device 130 and a temperature "H4" indicates a lower threshold of the allowable overheat protection function deactivating temperature range of the semiconductor device 130. In the testing method and testing device according to the embodiment, the temperatures H3 and H4 are predetermined temperatures and the semiconductor device 130 is designed such that the overheat protection function is deactivated in a temperature range between the temperature H3 and the temperature H4. That is, the overheat protection function deactivating temperature range indicates a temperature range between the temperature H3 and the temperature H4. If the overheat protection circuit serving as the overheat protection function in the semiconductor device 130 is capable of being deactivated within such an overheat protection function deactivating temperature range, the tested semiconductor device 130 may be determined as a qualified product. Notice that the temperature H3 is set to be lower than the temperature H2.

In the testing method and the testing device 100 according to the embodiment, the heating control device 123 heats the semiconductor device 130 in a range from the temperature "T" to the temperature "H4" such that other functional tests such as an electric property test may be conducted on the semiconductor device 130. Subsequently, a current is supplied via the probe 121 to the semiconductor device 130 to generate heat by itself such that the overheat protection function of the overheat protection circuit in the semiconductor device 130 is activated or deactivated based on the temperature of the semiconductor device 130. In doing so, an activation test and a deactivation test of the overheat protection function of the overheat protection circuit in the semiconductor device 130 may be conducted in the testing method and the testing device 100 according to the embodiment.

More specifically, in the testing method and the testing device 100 according to the embodiment, a diode forward voltage of the semiconductor element 133 is detected at an activation time at which the overheat protection function of the overheat protection circuit is activated and also detected at a deactivation time at which the overheat protection function of the overheat protection circuit is deactivated such that respective temperatures of the semiconductor device 130 at the activation time and the deactivation time may be computed based on the respective detected diode forward voltages. Subsequently, whether the semiconductor device 130 is a qualified product is determined based on the respective detected temperatures of the semiconductor device 130.

Figure 6:
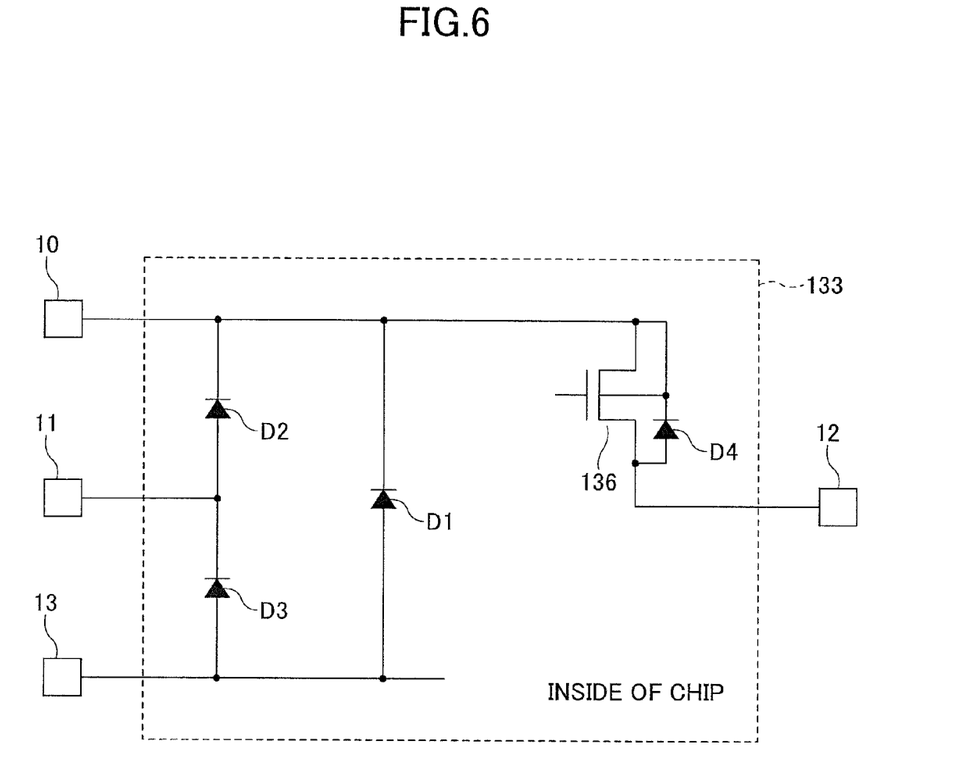
FIG. 6 is a diagram illustrating examples of diodes with which diode forward voltages are measured for determining whether a temperature range in which the overheat protection function is activated is appropriate.

FIG. 6 is a diagram illustrating examples of diodes with which diode forward voltages are measured for determining whether a temperature range in which the overheat protection function is activated is appropriate. The semiconductor element 133 utilized in the testing method and the testing device 100 according to the embodiment includes a power-supply terminal 10, an input terminal 11, an output terminal 12 and a ground terminal 13. The semiconductor element 133 utilized in the testing method and the testing device 100 according to the embodiment further includes diodes D1, D2, D3 and D4.

As illustrated in FIG. 6, the diodes connected to the external terminal 131 may include overheat protection diodes and a parasitic diode of an output driver transistor. The diodes D1, D2 and D3 are the overheat protection diodes of the semiconductor element 133 and the diode D4 is the parasitic diode of an output driver element 136.

In the testing method and the testing device 100 according to the embodiment, a diode forward voltage of the diode D4, which is the parasitic diode of an output driver element 136, is detected.

Figure 7:
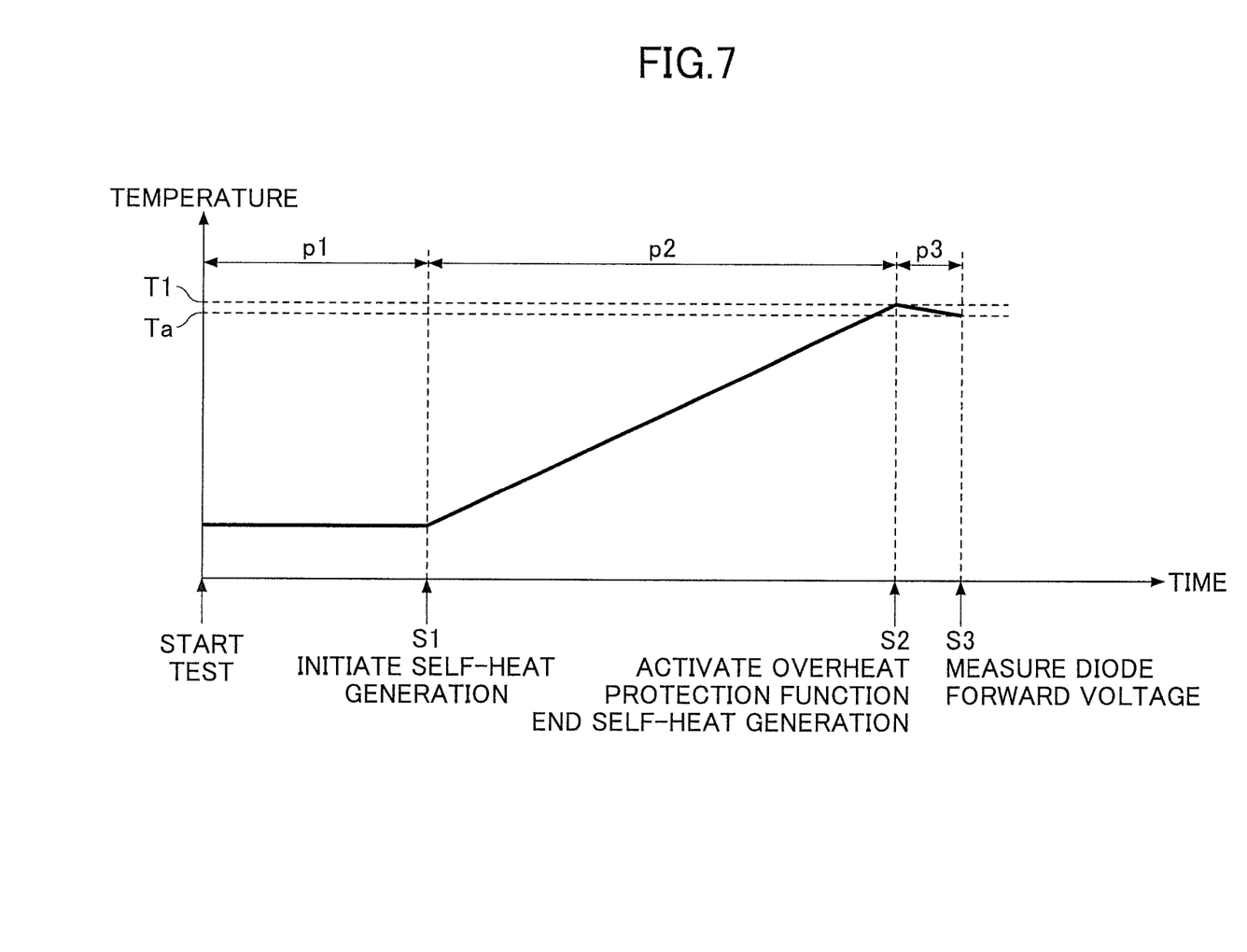
FIG. 7 is a diagram illustrating the temperature changes of the semiconductor device in a period from the start of the semiconductor device test to the end of an activation test of the overheat protection function.

FIG. 7 is a diagram illustrating the temperature changes of the semiconductor device 130 in a period from the start of the semiconductor device 130 test to the end of the activation test of the overheat protection function.

In the testing method and the testing device 100 according to the embodiment, when the activation test of the overheat protection function of the overheat protection circuit in the semiconductor device 130 is performed, the semiconductor device 130 is heated by the heating control device 123 such that the temperature of the semiconductor device 130 falls within a range from the temperature T to the temperature H4 before initiating the semiconductor device 130 test. If the temperature of the semiconductor device 130 resides within the above range (i.e., from the temperature T to the temperature H4), other functional tests other than the overheat protection function may be conducted. For example, whether the semiconductor device 130 appropriately operates within the operable temperature range may be tested. In FIG. 7, a period p1 is determined as a period where the temperature of the semiconductor device 130 resides in a range from the temperature T to the temperature H4.

Notice also that in FIG. 7, the functional tests other than the overheat protection functional test are conducted in the period p1 where the temperature of the semiconductor device 130 resides in a range from the temperature T to the temperature H4. However, the functional tests other than the overheat protection functional test may not be conducted in the period p1, and may be conducted in periods other than the period p1. For example, the functional tests other than the overheat protection functional test may be conducted in a period where the temperature of the semiconductor device 130 resides within the operable temperature range of the temperature T or lower. In this case, the semiconductor device 130 is heated until the temperature of the semiconductor device 130 is stabilized within the operable temperature range.

After the period p1, the testing device 100 supplies a current to the semiconductor device 130 via the probe 121 from a time S1 onward to initiate causing the semiconductor device 130 to generate heat by itself (self-heat generation). When the temperature of the semiconductor device 130 rises, the overheat protection function of the overheat protection circuit is activated at time S2. In FIG. 7, a period p2 is determined as a period from the time where the semiconductor device 130 has generated heat by itself (at time S1) to the time where the overheat protection function of the overheat protection circuit is activated (at time S2).

In the testing method and the testing device 100 according to the embodiment, a diode forward voltage of the diode D4 is detected when the overheat protection function is activated at time S2.

In the testing method and the testing device 100 according to the embodiment, when the overheat protection function is activated at time S2, a diode forward voltage of the diode D4 is detected at time S3. In the testing method and the testing device 100 according to the embodiment, a period p3 is determined as a period from the time S2 to time S3 as illustrated in FIG. 7. The period p3 indicates a time required for changing an operation mode of the overheat protection circuit to allow the semiconductor device 130 to generate heat by itself into another operation mode of the overheat protection circuit to detect a diode forward voltage of the diode D4.

In the testing device 100, when the processor 111 detects the diode forward voltage of the diode D4, the control device 110 computes a temperature Ta of the semiconductor device 130 based on the detected diode forward voltage of the diode D4. The temperature Ta is further described below. In the following, a case where the temperature Ta is computed utilizing the diode D4 arranged between the power-supply terminal 10 and the output terminal 12 is described.

In order to compute the temperature Ta, the voltage of a power-supply terminal 10 is set at 0 V and a positive voltage is then applied to the output terminal 12. When the voltage of the output terminal 12 reaches approximately 0.3 V, a current flows into the diode D4. The voltage of the output terminal 12 when a predetermined current flows into the diode D4 is defined as a voltage Vf (i.e., forward voltage).

In the testing method and the testing device 100 according to the embodiment, the voltage Vf is measured at a time immediately after the start of the semiconductor test and also measured at time S3 after the activation of the overheat protection function. When the forward voltage measured immediately after the start of the semiconductor test is defined as a voltage Vf1 and the forward voltage measured at time S3 is defined as a voltage Vf2, the temperature Ta of the semiconductor device 130 when the voltage Vf2 is detected is computed based on the following equation (1)

$$Ta = T0 + (Vf1 - Vf2) \times \Delta Vf \tag{1}$$

wherein T0 represents the temperature of the semiconductor device 130 immediately after the start of the semiconductor test (i.e., at the time where the voltage Vf1 is measured) and the voltage ΔVf represents the amount of change per 1° C. in the forward voltage of the diode D4. In the testing method and the testing device 100 according to the embodiment, the voltage ΔVf is approximately 2 mV/° C. Notice that the voltage ΔVf may be predetermined.

Further, the temperature Ta of the semiconductor device 130 may also be computed based on the following equation (2), $$Ta = (Vf0 - Vf2) \times \Delta Vf \tag{2}$$

wherein the voltage Vf0 represents a band gap of a semiconductor at the absolute zero point. Notice that in a case of a silicon semiconductor, the voltage Vf0 is approximately 1.25 V. The voltage Vf0 may also be predetermined.

Notice that in the above description, the detected diode forward voltage is that of the diode D4, which is the parasitic diode of an output driver element 136. However, the diode forward voltage detected in the testing method and the testing device 100 according to the embodiment may not be limited to the diode D4. In the testing method and the testing device 100 according to the embodiment, the diode forward voltage to be detected may be a diode forward voltage of any one of the overheat protection diodes arranged closest to an element monitoring a temperature of the semiconductor device 130 of all the elements implementing the overheat protection circuit in the semiconductor device 130.

In the testing method and the testing device 100 according to the embodiment, it is preferable to minimize an error range, which is a difference between the temperature Ta computed based on the diode forward voltage of the diode D4 and the temperature T1 of the semiconductor device 130 obtained when the overheat protection function of the overheat protection circuit is actually activated.

In the testing method and the testing device 100 according to the embodiment, the semiconductor device 130 generates heat by itself in the period p2, and ends the self-heat generation at time S2 by being cut off from the current supply. Consequently, the semiconductor device 130 generates no heat by itself and the temperature of the semiconductor device 130 lowers in the period p3. As a result, there may be a difference between the temperature Ta computed based on the diode forward voltage of the diode D4 and the temperature T1 of the semiconductor device 130.

Accordingly, in the testing method and the testing device according to the embodiment, the period p3 is made shorter than the period p2. A relationship between the period p2 and the period p3 is described below.

When the semiconductor device 130 generates heat by itself in the period p2, the overheat protection function of the overheat protection circuit is activated at a time at which the temperature of the semiconductor device 130 detected by the temperature detector 138 reaches the temperature T1. When the self-heat generation time is reduced to activate the overheat protection function, the output driver element 136 generates heat, thereby heating a predetermined narrow region of the semiconductor device 130. Since the temperature of the heated region of the semiconductor device 130 lowers with the ambient environment temperature, narrowing of the heated region may increase the decrease rate in the temperature of the semiconductor device 130 in the period p3, which may result in an increase in the difference between the temperature T1 and the temperature Ta.

By contrast, the longer the period p2, the larger the heated region of the semiconductor device 130 may become while the semiconductor device 130 generates heat by itself, which may inhibit the temperature of the semiconductor device 130 from lowering. This may decrease the decrease rate in the temperature of the semiconductor device 130 in the period p3.

Figure 8:
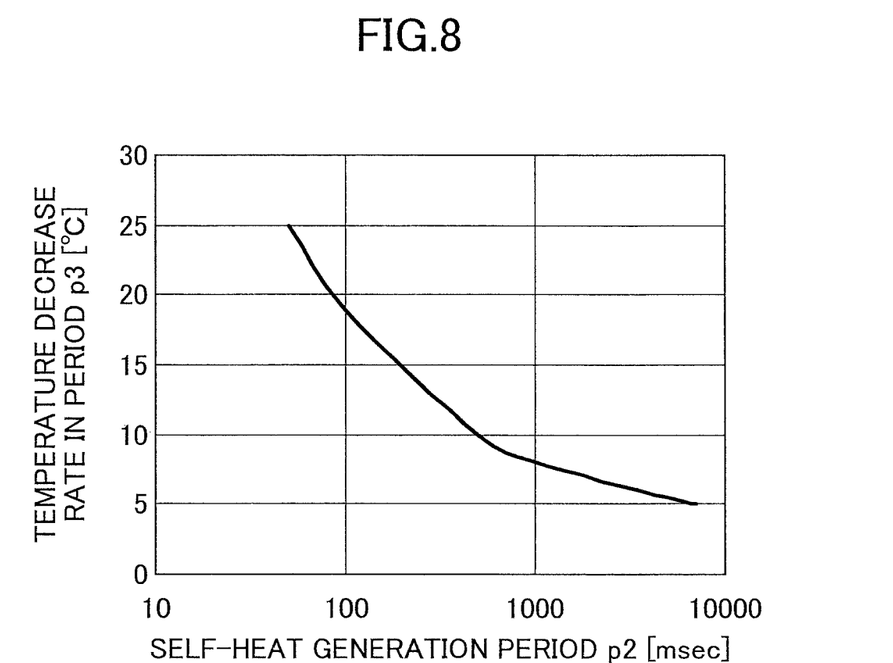
FIG. 8 is a diagram illustrating a temperature decrease rate of the semiconductor device in a period 3 as a function of a self-heat generation period p2.

FIG. 8 is a diagram illustrating a temperature decrease rate of the semiconductor device 130 in the period 3 as a function of the period p2 (self-heat generation period). The longer the period p2, the smaller the decrease rate of the semiconductor device 130 may become in the period p3.

Notice that in the testing method and the testing device 100 according to the embodiment, a large amount of electric energy may be consumed and some test involving self-heat generation may be conducted in the period p1. However, duration required for the tests in the period p1 may generally be short and the heated region of the semiconductor device 130 may be narrow. Accordingly, in the testing method and the testing device 100 according to the embodiment, it is preferable to make the period p2 longer than the period p1. An increase in the period p2 increases the heated region of the semiconductor device 130, which may reduce the decrease rate of the semiconductor device 130 in the period p3.

Next, an overheat protection function deactivation test conducted on the semiconductor device 130 is described.

In the testing method and the testing device 100 according to the embodiment, the overheat protection function deactivation test conducted via the overheat protection circuit may be carried out after having conducted functional tests other than the functional test of the overheat protection circuit. In this case, a testing process may include conducting the functional tests other than the functional test of the overheat protection circuit, allowing the semiconductor device 130 to generate heat by itself, activating the overheat protection function of the overheat protection circuit, applying a power supply voltage to the semiconductor device 130, deactivating the overheat protection function of the overheat protection circuit, and measuring a diode forward voltage of the diode D4. After the measurement of the diode forward voltage of the diode D4, the testing device 100 computes the temperature of the semiconductor device 130 when the overheat protection function is deactivated to determine whether the semiconductor device 130 is a qualified product based on the computed temperature.

Figure 9:
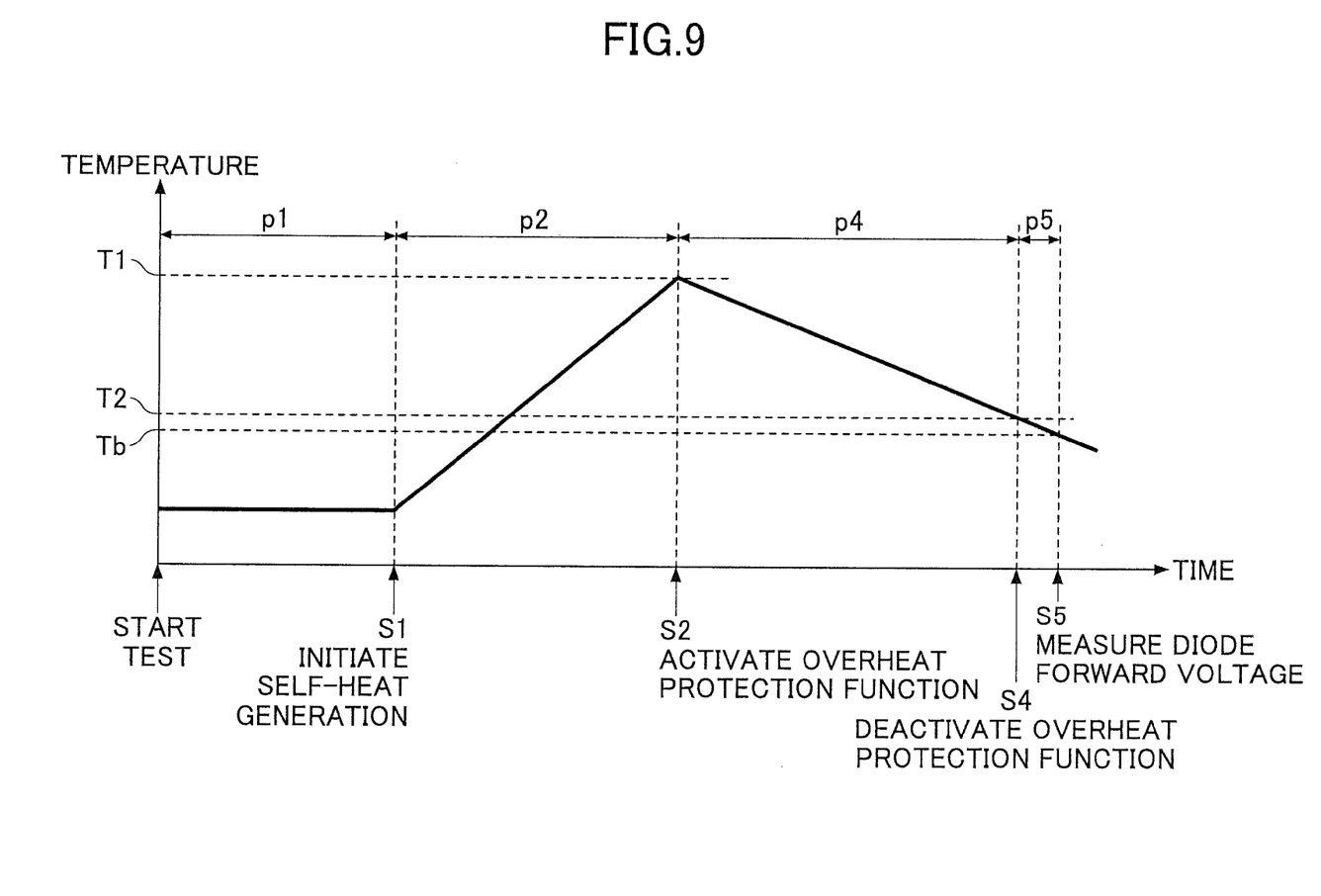
FIG. 9 is a diagram illustrating the temperature changes of the semiconductor device in a period from the initiation of the self-heat generation of the semiconductor device to the deactivation of the overheat protection function.

FIG. 9 is a diagram illustrating the temperature changes of the semiconductor device 130 in a period from the initiation of self-heat generation of the semiconductor device 130 to the deactivation of the overheat protection function.

After the period p1, the testing device 100 supplies a current to the semiconductor device 130 via the probe 121 from time S1 to initiate causing the semiconductor device 130 to generate heat by itself. When the temperature of the semiconductor device 130 rises, the overheat protection function of the overheat protection circuit is activated at time S2. After the activation of the overheat protection function at time S2, the semiconductor device 130 is allowed to lower its temperature while continuously receiving a power supply voltage. The temperature of the semiconductor device 130 is lowered to the temperature T2 after a period p4. In the semiconductor device 130, when the overheat protection function of the overheat protection circuit is deactivated at time S4 at which the temperature of the semiconductor device 130 reaches approximately the temperature T2, the output of the semiconductor device 130 is restarted.

In the testing method and the testing device 100 according to the embodiment, a diode forward voltage of the diode D4 is detected at time S5 after a period p5 when the overheat protection function is deactivated at time S4. The period p5 indicates a time required for changing an operation mode of operating the overheat protection function into another operation mode of detecting the diode forward voltage of the diode D4.

In the testing method and the testing device 100 according to the embodiment, a temperature Tb of the semiconductor device 130 when the overheat protection function is deactivated is computed based on the diode forward voltage of the diode D4 detected at time S5. The temperature Tb may be computed in the same method as the computation of the temperature Ta.

If the diode forward voltage of the diode D4 detected at time S5 is defined as a voltage Vf3, the temperature Tb of the semiconductor device 130 is computed based on the following equations (3) and (4).

$$Tb = T0 + (Vf1 - Vf3) \times \Delta Vf \quad (3)$$

$$Tb = (Vf0 - Vf3) \times \Delta Vf \quad (4)$$

In the testing method and the testing device 100 according to the embodiment, the temperature Ta at which the overheat protection function of the overheat protection circuit is activated and the temperature Tb at which the overheat protection function of the overheat protection circuit is deactivated are computed in the above-described manner.

Having computed the temperature Ta and the temperature Tb, the determining unit 112 of the control device 110 subsequently determines whether the temperature Ta resides in a range from the temperature H1 to the temperature H2. The determining unit 112 further determines whether the temperature Tb resides in a range from the temperature H3 to the temperature H4. If the temperature Ta satisfies a condition "H2<Ta<H1" and the temperature Tb satisfies a condition "H4<Tb<H3", the determining unit 112 determines the semiconductor device 130 as a qualified product. Further, if one of the temperatures Ta and Tb is outside of a corresponding one of the predetermined ranges (i.e., range from H1 to H2 for Ta and range from H3 to H4 for Tb), and fails to satisfy a corresponding one of the conditions "H2<Ta<H1" and "H4<Tb<H3", the determining unit 112 determines the semiconductor device 130 as an unqualified product.

As described above, in the testing method and the testing device 100 according to the embodiment, the functional tests other than the overheat protection function, and the activation test and the deactivation test of the overheat protection function of the overheat protection circuit may be conducted all at once by utilizing one handing device 120. The functional tests other than the overheat protection function in the semiconductor device 130 may be conducted within the operable temperature range of the semiconductor device 130. Alternatively, the overheat protection function in the semiconductor device 130 may be conducted within a temperature range of the semiconductor device 130 from the temperature T to the temperature H4.

In the testing method and the testing device 100 according to the embodiment, the temperature at which the overheat protection function of the overheat protection circuit is activated after the self-heat generation of the semiconductor device 130 and the temperature at which the overheat protection function of the overheat protection circuit is deactivated are computed based on the diode forward voltage of the diode D4. Further, in the testing method and the testing device 100 according to the embodiment, the period 2 in which the semiconductor device 130 generates heat by itself is sufficiently increased so as to minimize an error range, which is the difference between the temperature of the semiconductor device when the overheat protection function is activated and the temperature of the semiconductor device computed based on the diode forward voltage of the diode D4. Thus, in the testing method and the testing device 100 according to the embodiment, a series of tests may be accurately conducted all at once with feasible reproducibility.

In the testing method and the testing device 100 according to the embodiment, a case where the overheat protection function deactivation test of the overheat protection circuit is conducted after having conducted the functional tests other than the functional test of the overheat protection circuit is described. However, the overheat protection function deactivation test of the overheat protection circuit may be conducted after having conducted the overheat protection function activation test of the overheat protection circuit.

In this case, a testing process may include allowing the semiconductor device 130 to generate heat by itself, activating the overheat protection function of the overheat protection circuit, measuring a diode forward voltage of the diode D4, allowing the semiconductor device 130 to again generate heat by itself to reactivate the overheat protection function of the overheat protection circuit, applying the power supply voltage to the semiconductor device 130, deactivating the overheat protection function of the overheat protection circuit, and measuring a diode forward voltage of the diode D4. Notice that the functional tests other than the functional test of the overheat protection circuit may be conducted before the self-heat generation of the semiconductor device 130.

Figure 10:
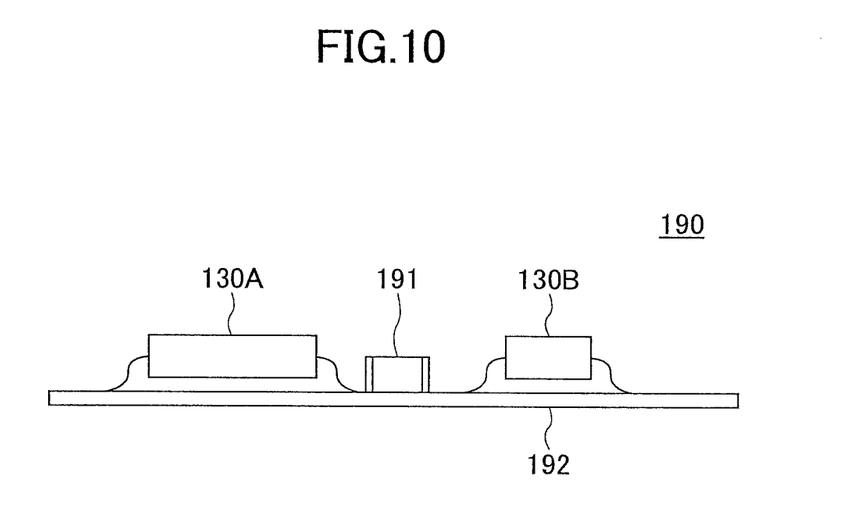
FIG. 10 is a diagram illustrating an electronic circuit on which the semiconductor device to be tested by the testing device according to the embodiment is implemented.

The testing method and the testing device 100 may be applied in a case where the semiconductor device 130 is implemented to an electronic circuit board. FIG. 10 is a diagram illustrating an electronic circuit on which the semiconductor device 130 utilized in the testing device 100 according to the embodiment is implemented.

The electronic circuit 190 illustrated in FIG. 10 includes a substrate 192, semiconductor devices 130A and 130B, and a capacitor 191 mounted on the substrate 192. In the following, a case where an output driver control circuit test is conducted on the semiconductor device 130A is described.

In the electronic circuit 190, after the substrate 192 is heated to a predetermined temperature, necessary electrical functional tests may be conducted. Subsequently, the semiconductor device 130A generates heat by itself to activate the output driver control circuit, and a diode forward voltage inside the semiconductor device 130A is measured. The temperature at which the overheat protection function of the overheat protection circuit is activated is tested in this continuously applied to the semiconductor device 130A, and the temperature of the semiconductor device 130A is lowered to deactivate the overheat protection function of the overheat protection circuit, a diode forward voltage inside the semiconductor device 130A is measured. The temperature at which the overheat protection function of the overheat protection circuit is deactivated is tested in this manner.

According to an embodiment, there is provided a testing method for testing a semiconductor device, which includes an overheat protection function activated when a temperature of the semiconductor device resides in an overheat protection function activating temperature range and deactivated when the temperature of the semiconductor device resides in an overheat protection function deactivating temperature range. The testing method includes heating the semiconductor device until the temperature of the semiconductor device reaches a predetermined temperature in a first step; conducting other functional tests other than testing of the overheat protection function in a second step after the temperature of the semiconductor device has reached the predetermined temperature in the first step; allowing the semiconductor device to generate heat by itself such that the overheat protection function of the semiconductor device is activated, detecting a first diode forward voltage of a desired diode contained in the semiconductor device when the overheat protection function of the semiconductor device is activated and computing a first computational temperature of the semiconductor device based on the detected first diode forward voltage of the desired diode contained in the semiconductor device in a third step; and determining whether the computed first computational temperature of the semiconductor device resides in the overheat protection function activating temperature range in a fourth step.

The testing method according to the embodiment further includes detecting a second diode forward voltage of the desired diode contained in the semiconductor device when the overheat protection function of the semiconductor device is deactivated and computing a second computational temperature of the semiconductor device based on the detected second diode forward voltage of the desired diode contained in the semiconductor device in a fifth step; and determining whether the computed second computational temperature of the semiconductor device resides in the overheat protection function deactivating temperature range in a sixth step.

In the testing method according to the embodiment, a period in which processing of the second step is conducted is shorter than a period in which processing of the third step is conducted.

In the testing method according to the embodiment, the predetermined temperature indicates a desired temperature in a range from a maximum operable temperature of the semiconductor device to a lower threshold of the overheat protection function deactivating temperature range of the semiconductor device.

In the testing method according to the embodiment, the desired diode is a parasitic diode of an output driver element contained in the semiconductor device.

In the testing method according to the embodiment, the desired diode is arranged closest to a temperature detector element in the semiconductor device configured to detect the temperature of the semiconductor device.

According to an embodiment, there is provided a testing device for testing a semiconductor device, which includes an overheat protection function activated when a temperature of the semiconductor device resides in an overheat protection function activating temperature range and deactivated when the temperature of the semiconductor device resides in an overheat protection function deactivating temperature range.

The testing device includes a heating unit configured to heat the semiconductor device until the temperature of the semiconductor device reaches a predetermined temperature; a test unit configured to conduct other functional tests other than testing of the overheat protection function after the temperature of the semiconductor device has reached the predetermined temperature; a self-heat generating unit configured to allow the semiconductor device to generate heat by itself such that the overheat protection function of the semiconductor device is activated; a computing unit configured to detect a diode forward voltage of a desired diode contained in the semiconductor device when the overheat protection function of the semiconductor device is activated and compute a computational temperature of the semiconductor device based on the detected diode forward voltage of the desired diode contained in the semiconductor device; and a determining unit configured to determine whether the computed computational temperature of the semiconductor device resides in the overheat protection function activating temperature range.

In the testing method and the testing device according to the embodiment, a series of tests may be accurately conducted all at once with feasible reproducibility by utilizing one handling device.

Embodiments have been described heretofore for the purpose of illustration; however, the present invention is not limited to these embodiments. Various variations and modifications may be made without The present application is based on Japanese priority application No. 2010-178442 filed on Aug. 9, 2010, with the Japanese Patent Office, the entire contents of which are hereby incorporated by reference.

What is claimed is:

1. A testing method for testing a semiconductor device, the semiconductor device including an overheat protection function activated when a temperature of the semiconductor device resides in an overheat protection function activating temperature range and deactivated when the temperature of the semiconductor device resides in an overheat protection function deactivating temperature range, the testing method comprising:
   heating the semiconductor device until the temperature of the semiconductor device reaches a predetermined temperature in a first step;
   conducting other functional tests other than testing of the overheat protection function in a second step after the temperature of the semiconductor device has reached the predetermined temperature in the first step;
   supplying to the semiconductor device a current via a testing device external to the semiconductor device, to initiate causing the semiconductor device to generate heat such that the overheat protection function of the semiconductor device is activated, detecting a first diode forward voltage of a desired diode contained in the semiconductor device when the overheat protection function of the semiconductor device is activated and computing a first computational temperature of the semiconductor device based on the detected first diode forward voltage of the desired diode contained in the semiconductor device in a third step,
   wherein the desired diode is a parasitic diode of an output driver element contained in the semiconductor device; and
   determining whether the computed first computational temperature of the semiconductor device resides in the overheat protection function activating temperature range in a fourth step.

2. The testing method as claimed in claim 1, further comprising:
   detecting a second diode forward voltage of the desired diode contained in the semiconductor device when the overheat protection function of the semiconductor device is deactivated and computing a second computational temperature of the semiconductor device based on the detected second diode forward voltage of the desired diode contained in the semiconductor device in a fifth step; and
   determining whether the computed second computational temperature of the semiconductor device resides in the overheat protection function deactivating temperature range in a sixth step.

3. The testing method as claimed in claim 1, wherein
   a period in which processing of the second step is conducted is shorter than a period in which processing of the third step is conducted.

4. The testing method as claimed in claim 1, wherein
   the predetermined temperature indicates a desired temperature in a range from a maximum operable temperature of the semiconductor device to a lower threshold of the overheat protection function deactivating temperature range of the semiconductor device.

5. The testing method as claimed in claim 1, wherein
   the desired diode is arranged closest to a temperature detector element in the semiconductor device configured to detect the temperature of the semiconductor device.

6. A testing device for testing a semiconductor device, the semiconductor device including an overheat protection function activated when a temperature of the semiconductor device resides in an overheat protection function activating temperature range and deactivated when the temperature of the semiconductor device resides in an overheat protection function deactivating temperature range, the testing device comprising:
   a heating unit configured to heat the semiconductor device until the temperature of the semiconductor device reaches a predetermined temperature;
   a test unit configured to conduct other functional tests other than testing of the overheat protection function after the temperature of the semiconductor device has reached the predetermined temperature;
   a self-heat generating unit configured to supply a current from the testing device to the semiconductor device, to cause the semiconductor device to generate heat such that the overheat protection function of the semiconductor device is activated;
   a computing unit configured to detect a diode forward voltage of a desired diode contained in the semiconductor device when the overheat protection function of the semiconductor device is activated and compute a computational temperature of the semiconductor device based on the detected diode forward voltage of the desired diode contained in the semiconductor device,
   wherein the desired diode is a parasitic diode of an output driver element contained in the semiconductor device; and
   a determining unit configured to determine whether the computed computational temperature of the semiconductor device resides in the overheat protection function activating temperature range.

7. A testing method for testing a semiconductor device, the semiconductor device including an overheat protection function activated when a temperature of the semiconductor device resides in an overheat protection function activating temperature range and deactivated when the temperature of the semiconductor device resides in an overheat protection function deactivating temperature range, the testing method comprising:

heating the semiconductor device until the temperature of the semiconductor device reaches a predetermined temperature in a first step;

conducting other functional tests other than testing of the overheat protection function in a second step after the temperature of the semiconductor device has reached the predetermined temperature in the first step;

supplying to the semiconductor device a current via a testing device external to the semiconductor device, to initiate causing the semiconductor device to generate heat such that the overheat protection function of the semiconductor device is activated, detecting a first diode forward voltage of a desired diode arranged closest to an element monitoring the temperature in the semiconductor device when the overheat protection function of the semiconductor device is activated and computing a first computational temperature of the semiconductor device based on the detected first diode forward voltage of the desired diode contained in the semiconductor device in a third step; and determining whether the computed first computational temperature of the semiconductor device resides in the overheat protection function activating temperature range in a fourth step.

* * * * *